United States Patent
Chuang et al.

(10) Patent No.: US 9,634,029 B2
(45) Date of Patent: *Apr. 25, 2017

(54) THIN FILM TRANSISTOR SUBSTRATE AND DISPLAY DEVICE HAVING SAME

(71) Applicant: E Ink Holdings Inc., Hsinchu (TW)

(72) Inventors: Kai-Cheng Chuang, Hsinchu (TW); Chao-Jung Chen, Hsinchu (TW); I-Hsuan Chiang, Hsinchu (TW)

(73) Assignee: E INK HOLDINGS INC., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/740,380

(22) Filed: Jun. 16, 2015

(65) Prior Publication Data

US 2015/0279862 A1    Oct. 1, 2015

Related U.S. Application Data

(63) Continuation-in-part of application No. 13/396,784, filed on Feb. 15, 2012, now Pat. No. 9,087,810.

(30) Foreign Application Priority Data

Mar. 17, 2011    (TW) .............................. 100109211 A

(51) Int. Cl.
*H01L 29/08*     (2006.01)
*H01L 35/24*     (2006.01)
(Continued)

(52) U.S. Cl.
CPC ...... *H01L 27/1218* (2013.01); *H01L 27/1222* (2013.01); *H01L 27/1225* (2013.01);
(Continued)

(58) Field of Classification Search
CPC ... H01L 29/786; H01L 29/04; H01L 27/1233; H01L 27/1251; H01L 27/1288; H01L 27/78696; H01L 27/78648
See application file for complete search history.

(56) References Cited

U.S. PATENT DOCUMENTS 6,046,479 A    4/2000    Young et al.
6,281,552 B1    8/2001    Kawasaki et al.
(Continued)

FOREIGN PATENT DOCUMENTS

CN    101626036 A    1/2010
TW    201104874 A1    2/2011
(Continued)

OTHER PUBLICATIONS

China Patent Office, "Office Action", Apr. 2, 2014.
Taiwan Patent Office, "Office Action", Apr. 18, 2014.

*Primary Examiner* — Zandra Smith
*Assistant Examiner* — John M Parker
(74) *Attorney, Agent, or Firm* — WPAT, PC; Justin King

(57) ABSTRACT

A thin film transistor (TFT) substrate includes a substrate which is a flexible substrate, and a TFT structure disposed on the substrate and including a gate layer, a gate insulator layer, a first channel island and a second channel island. The gate layer is disposed on the substrate and including a first gate electrode and a second gate electrode electrically connected to each other. The first and second gate electrodes are parts of the same TFT structure. The gate insulator layer covers the first and second gate electrodes. The first and second channel islands are disposed on the gate insulator layer and respectively correspond to the first and second gate electrodes. The source and drain layer is disposed on the gate insulator layer and next to the first and second channel islands, wherein the source and drain layer partially covers top surfaces of the first and second channel islands.

16 Claims, 8 Drawing Sheets

(51) Int. Cl.
   *H01L 51/00*   (2006.01)
   *H01L 27/12*   (2006.01)
   *H01L 51/05*   (2006.01)
   *H01L 29/417*  (2006.01)
   *H01L 29/786*  (2006.01)
   *H01L 27/32*   (2006.01)

(52) U.S. Cl.
   CPC .. *H01L 29/41733* (2013.01); *H01L 29/78603* (2013.01); *H01L 29/78696* (2013.01); *H01L 51/0545* (2013.01); *H01L 27/3262* (2013.01); *H01L 27/3274* (2013.01); *H01L 29/786* (2013.01); *H01L 2251/5338* (2013.01)

(56) References Cited

U.S. PATENT DOCUMENTS

| | | | |
|---|---|---|---|
| 7,098,087 B2 | 8/2006 | Akimoto et al. | |
| 7,163,850 B2 | 1/2007 | Oda et al. | |
| 7,176,074 B1* | 2/2007 | Shiau | H01L 21/31144 257/E21.257 |
| 8,395,156 B2 | 3/2013 | Miyairi et al. | |
| 2005/0242713 A1* | 11/2005 | Yamazaki | H01L 51/5284 313/503 |
| 2006/0102954 A1* | 5/2006 | Ryu | H01L 51/0545 257/347 |
| 2006/0108581 A1* | 5/2006 | Ahn | B82Y 30/00 257/40 |
| 2010/0025677 A1 | 2/2010 | Yamazaki et al. | |
| 2011/0031499 A1* | 2/2011 | Kimura | H01L 27/124 257/59 |
| 2011/0045558 A1 | 2/2011 | Bauweleers et al. | |
| 2011/0121300 A1 | 5/2011 | Miyairi et al. | |
| 2012/0025320 A1* | 2/2012 | Chen | H01L 27/1225 257/369 |

FOREIGN PATENT DOCUMENTS

| | | |
|---|---|---|
| TW | 201108417 A | 3/2011 |
| TW | 201110346 A | 3/2011 |

* cited by examiner

US 9,634,029 B2

THIN FILM TRANSISTOR SUBSTRATE AND DISPLAY DEVICE HAVING SAME

CROSS-REFERENCE TO RELATED APPLICATIONS

This application is a continuation-in-part application of an application Ser. No. 13/396,784, filed on Feb. 15, 2012, and based upon and claims the benefit of priority from the prior Taiwanese Patent Application No. 100109211, filed Mar. 17, 2011, the entire contents of which are incorporated herein by reference.

FIELD OF THE INVENTION

The present invention generally relates to a display device, and more particularly relates to a thin film transistor (TFT) substrate and a display device having the same.

BACKGROUND OF THE INVENTION

TFTs have been widely used in display applications such as liquid crystal displays (LCDs), electronic paper displays (EPDs), and organic light emitting diode displays (OLEDs).

Generally, a TFT structure includes a substrate, a gate electrode, a gate insulator layer, a channel island, a source electrode, and a drain electrode. The gate electrode is disposed on the substrate, the gate insulator layer covers the gate electrode, the channel island is disposed on the gate insulator layer, and the source electrode and the drain electrode are disposed on the channel island.

The above-described type of TFT can be well used in a LCD. However, if the TFT structure is used in an EPD, the channel island might become conductive after being irradiated by external light, which resulting in current leakage occurring in the channel island. As a result of the current leakage, the EPD suffers from abnormal displaying (e.g. image or color distortion).

Therefore, how to avoid abnormal displaying and improve displaying quality of EPDs becomes the area that researchers and developers are focused on.

SUMMARY OF THE INVENTION

In accordance with the present invention, a TFT substrate having a dual channel island structure is provided for minimizing the irradiation effect of external light.

A display device including the desirable TFT substrate is also provided.

Another TFT substrate having a dual channel island structure and a dual top gate structure is also provided for minimizing the irradiation effect of external light.

In accordance with an embodiment the present invention, a TFT substrate including a substrate and a TFT structure is provided. The substrate is a flexible substrate. The TFT structure is disposed on the substrate and includes a gate layer, a gate insulator layer, a first channel island, a second channel island, and a source and drain layer. The gate layer is disposed on the substrate and includes a first gate electrode and a second gate electrode electrically connected to the first gate electrode, wherein the first gate electrode and the second gate electrode are parts of the same TFT structure. The gate insulator layer is disposed on the substrate and covers the first and second gate electrodes. The first channel island is disposed on the gate insulator layer and corresponds to the first gate electrode, while the second channel island is disposed on the gate insulator layer and corresponds to the second gate electrode. The source and drain layer is disposed on the gate insulator layer and next to the first and second channel islands, wherein the source and drain layer partially covers a top surface of the first channel island and a top surface of the second channel island.

In accordance with an embodiment the present invention, a display device including a TFT substrate, an opposite substrate disposed opposite to the TFT substrate, and a display medium layer disposed between the TFT substrate and the opposite substrate is provided. The TFT substrate includes a substrate, a TFT structure disposed on the substrate, a passivation layer and a pixel electrode, wherein the substrate is a flexible substrate and the TFT structure includes a gate layer, a gate insulator layer, a first channel island, a second channel island, and a source and drain layer. The gate layer is disposed on the substrate and including a first gate electrode and a second gate electrode electrically connected to the first gate electrode, wherein the first gate electrode and the second gate electrode are parts of the same TFT structure. The gate insulator layer is disposed on the substrate and covers the first and second gate electrodes. The first channel island is disposed on the gate insulator layer and corresponds to the first gate electrode. The second channel island is disposed on the gate insulator layer and corresponds to the second gate electrode. The source and drain layer is disposed on the gate insulator layer and next to the first and second channel islands, wherein the source and drain layer partially covers a top surface of the first channel island and a top surface of the second channel island. Further, the passivation layer covers the source and drain layer and the first and second channel islands, while the pixel electrode is disposed on the passivation layer and electrically connected to a drain electrode of the source and drain layer.

In accordance with another embodiment the present invention, a TFT substrate including a substrate and a TFT structure disposed on the substrate is also provided. The TFT structure includes a source and drain layer, a first channel island, a second channel island, a gate insulator layer, and a gate layer. The source and drain layer is disposed on the substrate and includes a source electrode, a drain electrode and an intermediate electrode disposed between the drain electrode and the source electrode. The first channel island partially covers the source electrode and the intermediate electrode, while the second channel island partially covers the drain electrode and the intermediate electrode. The gate insulator layer covers the source and drain layer and the first and second channel islands. The gate layer is disposed on the gate insulator layer and includes a first gate electrode and a second gate electrode electrically connected to the first gate electrode. The first gate electrode and the second gate electrode respectively correspond to the first channel island and the second channel island, and the first gate electrode and the second gate electrode are parts of the same TFT structure.

The above-described TFT substrates as well as the display device include any of the TFT structures include dual channel islands, thereby preventing current leakage caused by external light. As a result, the abnormal displaying of the display device can be avoided and it is helpful to improve the display quality of the display device.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
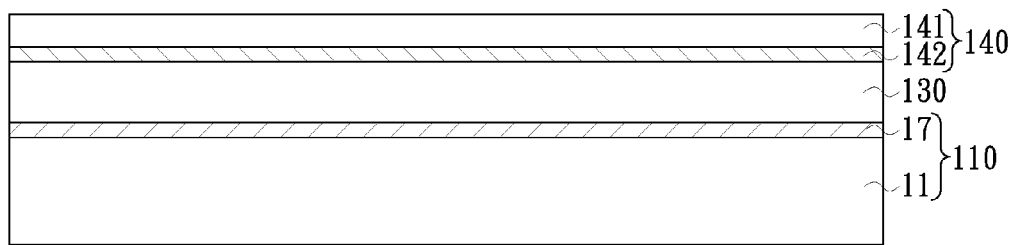
FIG. 1 is a schematic view showing a display device according to one embodiment of the present invention.

FIG. 1 is a schematic view showing a display device according to one embodiment of the present invention. Referring to FIG. 1, a display device 100 includes a TFT substrate 110, a display medium layer 130 and an opposite substrate 140. The opposite substrate 140 is disposed opposite to the TFT substrate 110, and the display medium layer 130 is disposed between the TFT substrate 110 and the opposite substrate 140.

The display device 100 is, for example, but not limited to, an electronic paper display device. In this embodiment, the display medium layer 130 can be an electrophoretic display layer. Further, the opposite substrate 140 may include a base 141 and a common electrode 142 disposed on the base 141 and located between the display medium layer 130 and the base 141. The base 141 can be, but not limited to, a flexible film made of plastic such as polyimide (PI) or polyethylene terephthalate (PET). The common electrode 142 may be a light transmissive electrode made of light transmissive and conductive material such as indium tin oxide (ITO) or indium zinc oxide (IZO). In one embodiment, the opposite substrate 140 and the display medium layer 130 may be integrated into a front laminate plate (FPL). In another embodiment, the base 141 can be a rigid base such as glass base.

Figure 2:
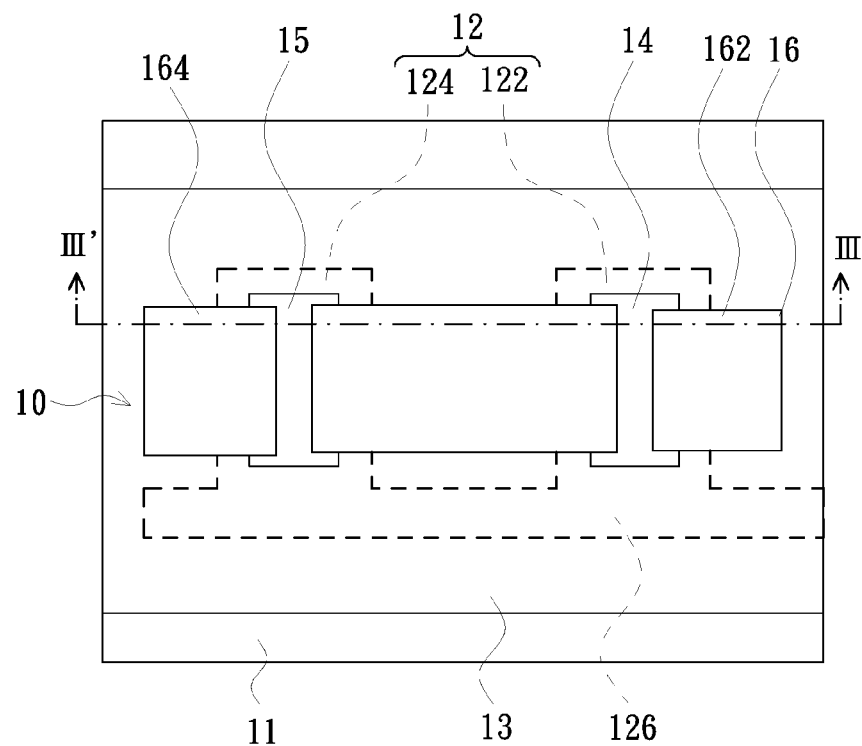
FIG. 2 is a schematic top view of a TFT substrate according to a first embodiment of the present invention, applicable to the TFT substrate shown in FIG. 1.
Figure 3:
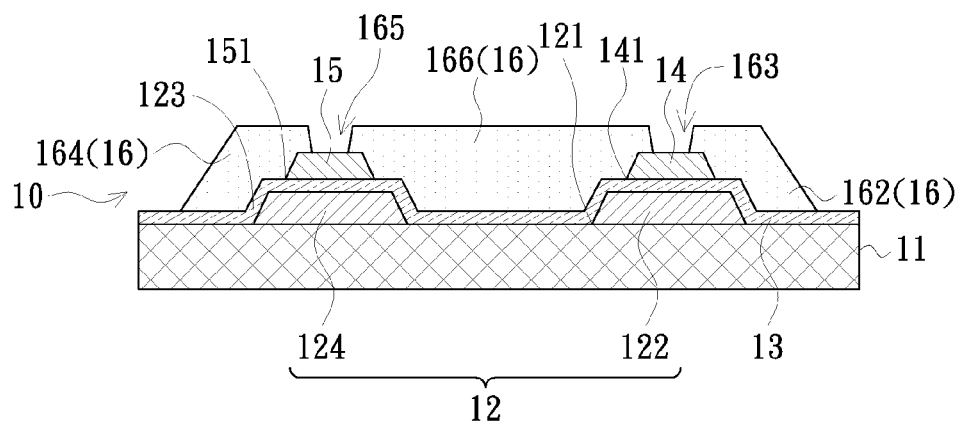
FIG. 3 is a schematic cross-sectional view taken along a line III-III' of the TFT structure shown in FIG. 2.

The TFT substrate 110 includes a substrate 11 and a TFT array 17 disposed on the substrate, wherein the substrate 11 may be a rigid substrate such as glass substrate and the TFT array 17 includes a plurality of TFT structures. FIG. 2 is a schematic top view illustrating a TFT structure of a first embodiment of the present invention. FIG. 3 is a schematic cross-sectional view taken along a line III-III' of the TFT structure shown in FIG. 2. Referring to FIGS. 2 and 3, each of the TFT structures 10 includes a gate layer 12, a gate insulator layer 13, a first semiconductor island 14 serving as a first channel island, a second semiconductor island 15 serving as a second channel island and a source and drain layer 16. It is to be noted that the term "source and drain layer" used herein indicates that a source electrode and a drain electrode are included in this layer to form a part of the TFT. The relative positions of the source electrode and the drain electrode are variable and the manufacturing processes of the source electrode and the drain electrode can be integrated or independent, depending on practical requirements. The gate layer 12 is disposed on the substrate 11, and includes a first gate electrode 122 and a second gate electrode 124 electrically connected to each other, wherein the first gate electrode 122 and the second gate electrode 124 are parts of the same TFT structure 10. The gate insulator layer 13 is disposed on the substrate 11 and covers the gate layer 12. The first semiconductor island 14 is disposed on the gate insulator layer 13 and above the first gate electrode 122, and covers a portion of the gate insulator layer 13 that is on the first gate electrode 122. The second semiconductor island 15 is disposed on the gate insulator layer 13 and above the second gate electrode 124, and covers a portion of the gate insulator layer 13 that is on the second gate electrode 124. The source and drain layer 16 partially covers a top surface of the first semiconductor island 14 and a top surface of the second semiconductor island 15. The source and drain layer 16 overlies the resulting substrate with recesses 163 and 165 for partially exposing the first semiconductor island 14 and the second semiconductor island 15. The source and drain layer 16 includes a source electrode 162, a drain electrode 164 and an intermediate electrode 166 disposed between the drain electrode 164 and the source electrode 162. For example, the source electrode 162 is disposed next to the first semiconductor island 14, and the drain electrode 164 is disposed next to the second semiconductor island 15. The intermediate electrode 166 covers an interval between the first gate electrode 122 and the second gate electrode 124. The intermediate electrode 166, the drain electrode 164 and the source electrode 162 belong to the same source and drain layer 16 of the TFT structure 10. However, configuration of the source and drain layer 16 is not limited as described above.

In this embodiment, the first gate electrode 122 and the second gate electrode 124 are electrically connected to each other via a gate line 126. The first gate electrode 122 and the second gate electrode 124 may be directly connected to the same gate line 126. In particular, the gate line 126, the first gate electrode 122, and the second gate electrode 124 can be simultaneously formed to simplify the manufacturing process.

As shown in FIG. 3, both the first semiconductor island 14 and the second semiconductor island 15 have an "island in" structure. That is, the entire circumference 141 of the first semiconductor island 14 in a top view is inward offset from the circumference 121 of the first gate electrode 122. Likewise, the entire circumference 151 of the second semiconductor island 15 in a top view is inward offset at a certain distance from the circumference 123 of the second gate electrode 124.

The TFT structure 10 can be replaced by any one of following TFT structures according to different embodiments of the present invention.

Figure 4:
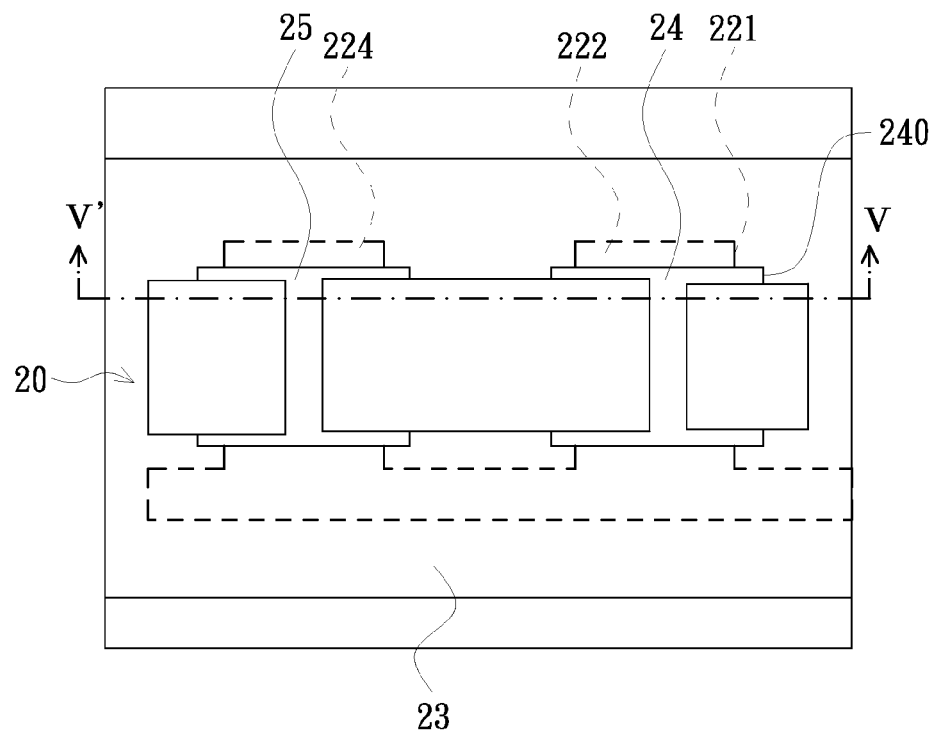
FIG. 4 is a schematic top view of a TFT structure according to a second embodiment of the present invention, applicable to the TFT substrate shown in FIG. 1.
Figure 5:
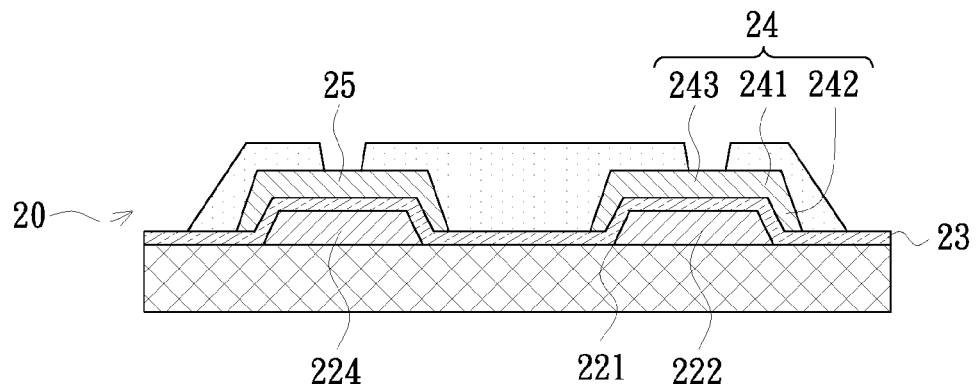
FIG. 5 is a schematic cross-sectional view taken along a line V-V' of the TFT structure shown in FIG. 4.

Please refer to FIG. 4 and FIG. 5, in which a TFT structure of a second embodiment of the present invention is schematically illustrated, and FIG. 5 is a schematic cross-sectional view taken along a line V-V' of FIG. 4. In this embodiment, a TFT structure 20 includes a first semiconductor island 24 and a second semiconductor island 25, both of which have an "island out" structure. That is, opposite lateral sides 240 of the first semiconductor island 24 are outward offset from corresponding lateral sides 221 of the first gate electrode 222. The first semiconductor island 24 includes a central portion 243, a circumferential portion 242 and a bending portion 241 disposed between the central portion 243 and the circumferential portion 242, and having a turning corner. With the bending portion 241, the circumferential portion 242 deflects from the central portion 243 and extends downwards to surround the first gate electrode 222. For minimizing the area of the island, the bending portion 241 may be arranged substantially right above the lateral side 221 of the first gate electrode 222. On the other hand, the circumferential portion 242 of the first semiconductor island 24 desirably extends down to the gate insulator layer 23 overlying on the substrate. Similar arrangement can be made to the second semiconductor island 25, and thus it is not redundantly described herein.

Figure 6:
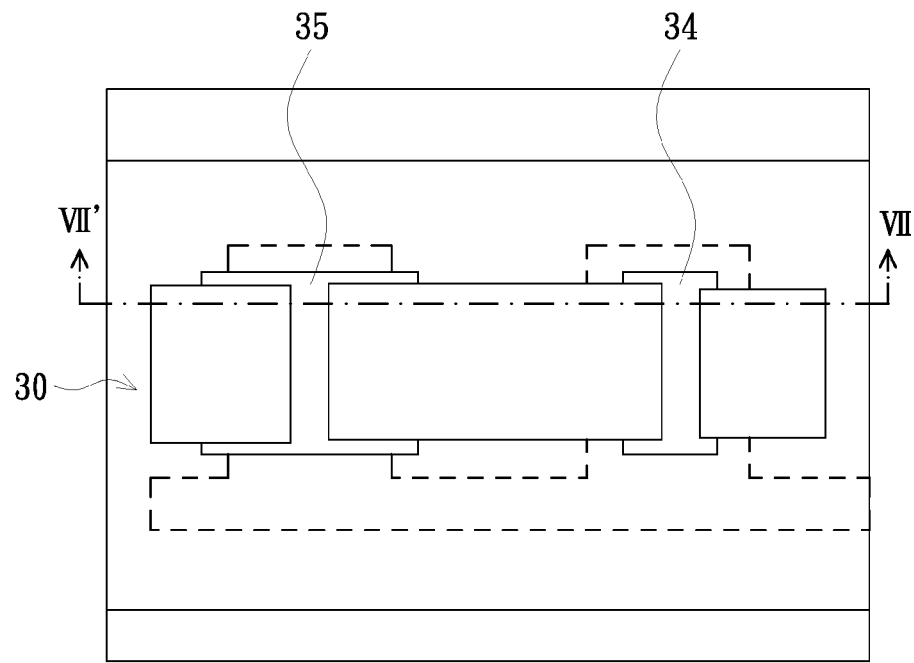
FIG. 6 is a schematic top view of a TFT structure according to a third embodiment of the present invention, applicable to the TFT substrate shown in FIG. 1.
Figure 7:
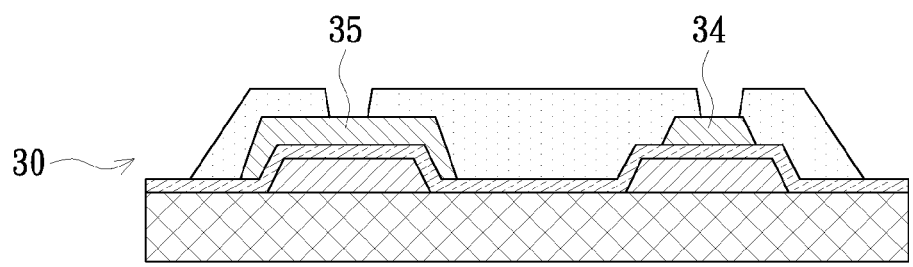
FIG. 7 is a schematic cross-sectional view taken along a line VII-VII' of the TFT structure shown in FIG. 6.

FIG. 6 is a schematic top view of a TFT structure in accordance with a third embodiment of the present invention, and FIG. 7 is a schematic cross-sectional view taken along a line VII-VII' of FIG. 6. Referring to FIGS. 6 and 7, a TFT structure 30 includes a first semiconductor island 34 having an "island in" structure and a second semiconductor island 35 having an "island out" structure, as described above.

Figure 8:
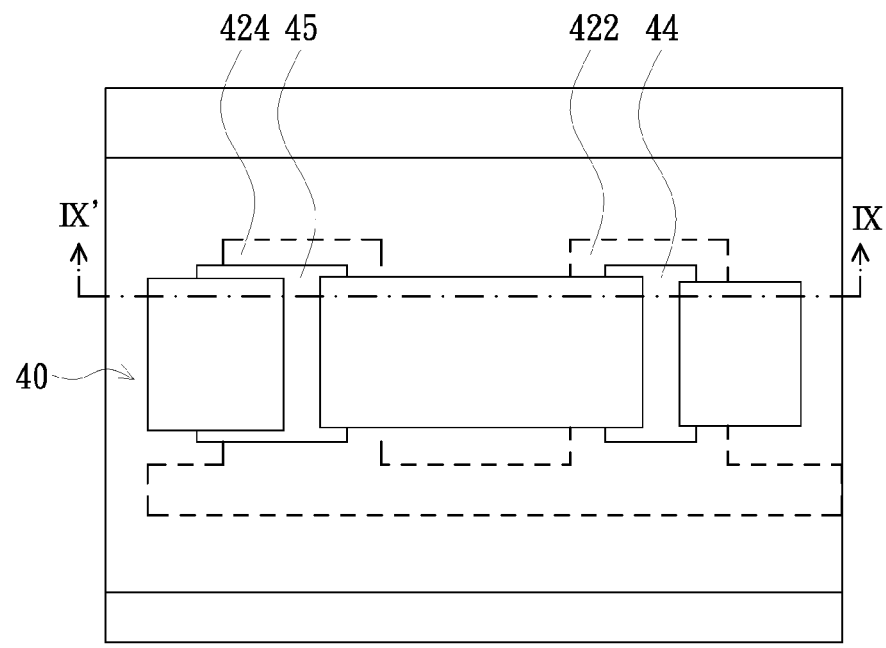
FIG. 8 is a schematic top view of a TFT structure according to a fourth embodiment of the present invention, applicable to the TFT substrate shown in FIG. 1.
Figure 9:
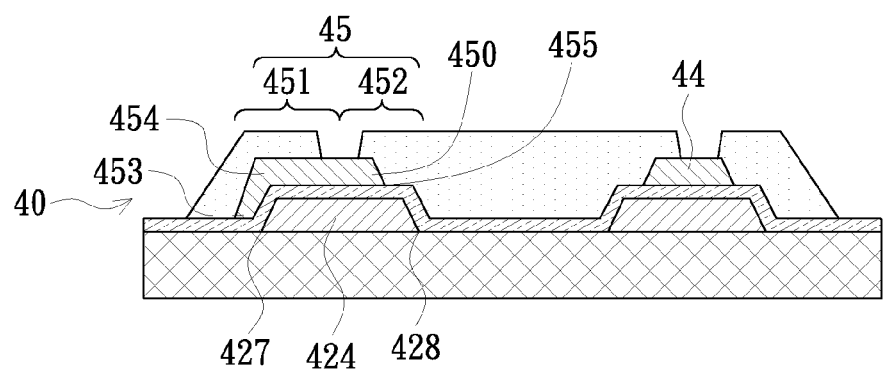
FIG. 9 is a schematic cross-sectional view taken along a line IX-IX' of the TFT structure shown in FIG. 8.

FIG. 8 is a schematic top view of a TFT structure in accordance with a fourth embodiment of the present invention, and FIG. 9 is a schematic cross-sectional view taken along a line IX-IX' of FIG. 8. Referring to FIGS. 8 and 9, in a TFT structure 40 includes a first semiconductor island 44 having an "island in" structure as described above, and a second semiconductor island 45 having a partially in and partially out structure. That is, a first part 451 of the second semiconductor island 45 at a lateral side is "island out", and a second part 452 of the second semiconductor island 45 at an opposite lateral side is "island in". For example, the first part 451 of the second semiconductor island 45 has a circumferential portion 453 deflecting from a central portion 450 and extending downwards from a bending portion 454. The bending portion 454 is arranged right above the first edge 427 of the gate electrode 424. On the other hand, a circumference 455 of the second part 452 of the second semiconductor island 45 is inward offset at a certain distance from a second edge 428 of the gate electrode 424. The second edge 428 is opposite to the first edge 427. It is to be noted that the above-described configurations are just give for examples, and variations can be made depending on practical requirements. For example, it is feasible that the semiconductor island 34 is "island out" while the semiconductor island 35 is "island in"; or the first semiconductor island 44 is "partially island out and partially island in" while the second semiconductor island 45 is "island in". Alternatively, both the first and second semiconductor islands 44 and 45 can be "partially island out and partially island in".

Any of the above embodiments of TFT structures 10, 20, 30, 40, each having a dual channel island structure, is applicable to the TFT substrate 110 of the display device 100. The dual channel island structure can prevent current leakage caused by external light. Thus, the dual channel island structure is advantageous in preventing abnormal displaying and improving display quality of the display device 100. The alternate "island in" and "island out" structures further minimize common voltage coupling.

Figure 10:
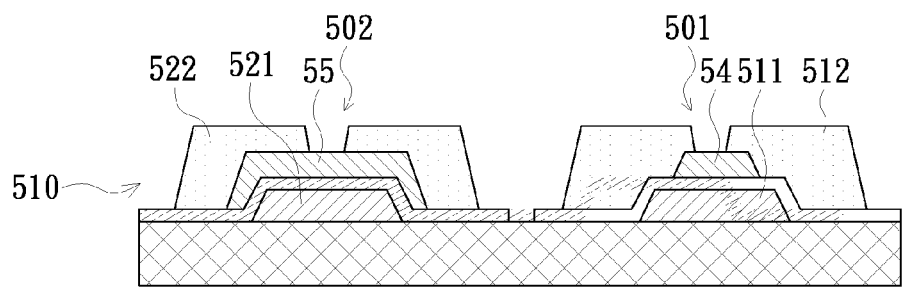
FIG. 10 is a schematic cross-sectional view of a TFT structure according to a fifth embodiment of the present invention, applicable to the TFT substrate shown in FIG. 1.

Instead of a single TFT with two different channel island structures corresponding two gate electrodes, the TFT structure used in a display device according to the present invention may alternatively include TFTs having different channel island structures. For example, referring to FIG. 10, a TFT structure 510 includes a first TFT unit 501 and a second TFT unit 502 adjacent to the first TFT structure 501. The first TFT unit 501 includes a first semiconductor island 54 serving as a channel island above a gate electrode 511 between source/drain electrodes 512, and a second TFT unit 502 includes a second semiconductor island 55 serving as a channel island above a gate electrode 521 between source/drain electrodes 522. The displaying effect can be improved by differentiating the first semiconductor island 54 from the second semiconductor island 55. For example, the first semiconductor island 54 has an "island in" structure and the second semiconductor island 55 has an "island out" structure, as described above.

Figure 11:
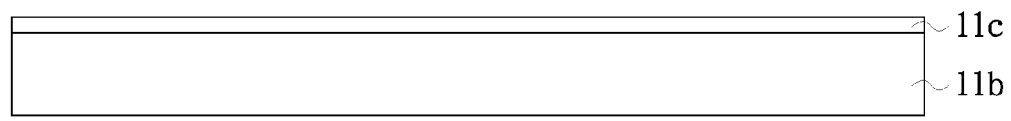
FIG. 11 is a schematic view showing a flexible substrate according to one embodiment of the present invention.

It should be noted that the substrate 11 of each of the above embodiments can be replaced by a substrate 11a shown in FIG. 11. The substrate 11a is a flexible substrate such as plastic substrate. The substrate 11a may, but not limited to, include a flexible base 11b and a barrier layer 11c disposed on the flexible base 11b. The flexible base 11b may be a plastic base which may be made of at least one of PI and PET. The barrier layer 11c may be served as a barrier to oxygen and moisture and may be, but not limited to, a single layer structure or a multilayer structure and made of at least one of silicon nitride ($SiN_x$), silicon oxide ($SiO_x$), silicon oxynitride ($SiO_xN_y$) and organic-inorganic composite material. The barrier layer 11c may have a thickness of about 50-3000 nm such as 1500 nm.

Since the TFT structures of above embodiments respectively include the dual channel island structure, current leakage is prevented even if the display device having the substrate 11a is curved.

Further, in above embodiments, each of the first semiconductor islands 14, 24, 34, 44, 54 served as the first channel island and each of the second semiconductor islands 15, 25, 35, 45, 55 served as the second channel island are, for example, made of inorganic semiconductor martial such as amorphous silicon. In other embodiments, the first channel island and the second channel island may be made of organic semiconductor material such as pentacene, or made of metal oxide such as indium gallium zinc oxide (IGZO), indium gallium oxide (IGO) or indium zinc oxide (IZO).

Figure 12:
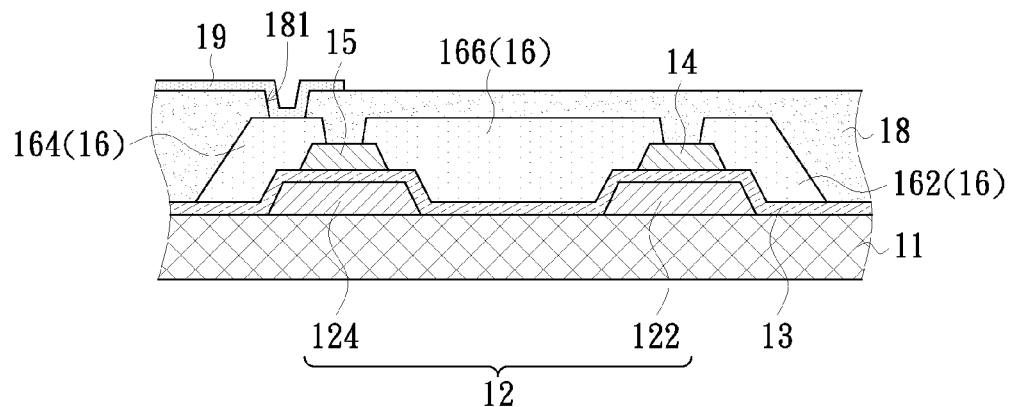
FIG. 12 is a schematic cross-sectional view showing a TFT substrate having a passivation layer and a pixel electrode according to one embodiment of the present invention.

Moreover, each of the TFT substrates of the above embodiments may further include a passivation layer and a pixel electrode. For example, referring to FIG. 12, the TFT substrate of FIG. 12 is similar to the TFT substrate of FIG. 3, the main difference is the TFT substrate of FIG. 12 further includes a passivation layer 18 and a pixel electrode 19. The passivation layer 18 covers the source and drain layer 16 and the first and second semiconductor islands 14, 15. The pixel electrode 19 is disposed on the passivation layer 18 and electrically connected to the drain electrode 164 of the source and drain layer 16. More specifically, the passivation layer 18 has a via hole 181, and the pixel electrode 19 is connected to the drain electrode 164 through the via hole 181. The passivation layer 16 may be made of at least one of resin, silicon oxide, silicon nitride and silicon oxynitride. According to different demands, the pixel electrode 19 may be made of light reflective material such as metal, or light transmissive material such as ITO or IZO.

Figure 13:
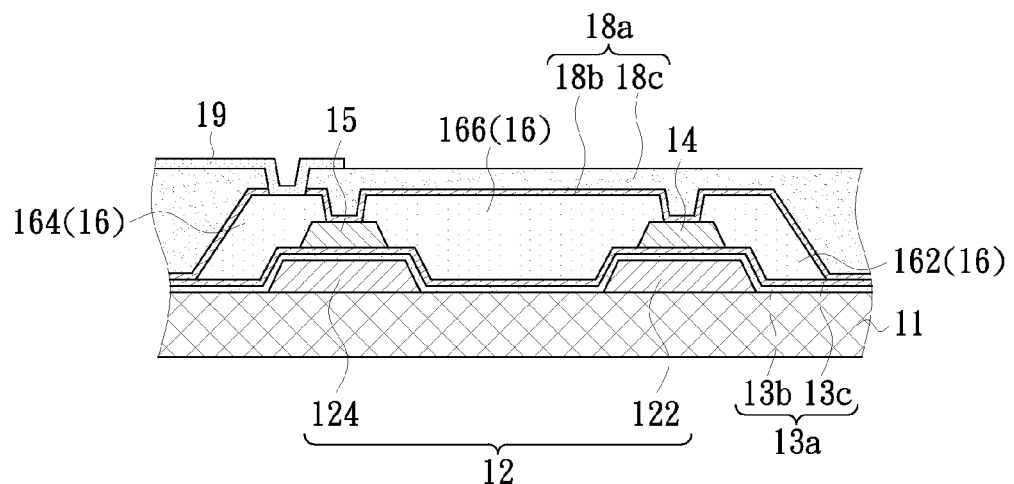
FIG. 13 is a schematic cross-sectional view showing a TFT substrate having a passivation layer and a pixel electrode according to another embodiment of the present invention.

Moreover, the passivation layer 18 and the gate insulator layer 13 are, for example, respectively a single layer structure. In another embodiment, the single layer structure may be replaced by a multilayer structure. For example, referring to FIG. 13, the gate insulator layer 13a is a first multilayer structure which includes a first silicon nitride layer 13b and a first silicon oxide layer 13c. The first silicon nitride layer 13b covers the first and second gate electrodes 122, 124, and the first silicon oxide layer 13c covers the first silicon nitride layer 13b. Further, the passivation layer 18a is a second multilayer structure which includes a second silicon oxide layer 18b and a second silicon nitride layer 18c. The second silicon oxide layer 18b covers the source and drain layer 16 and the first and second semiconductor islands 14, 15, and the second silicon nitride layer 18c covers the second silicon oxide layer 18b. Because of the first silicon oxide layer 13c and the second silicon oxide layer 18b, the first silicon nitride layer 13b and the second silicon nitride layer 18c are not directly contacted the first and second semiconductor islands 14, 15. When the first and second semiconductor islands 14, 15 are replaced by other first and second channel islands made of metal oxide such as IGZO, improper reaction between the first and second channel islands and the first and second silicon nitride layers 13b, 18c can be prevented.

Figure 14:
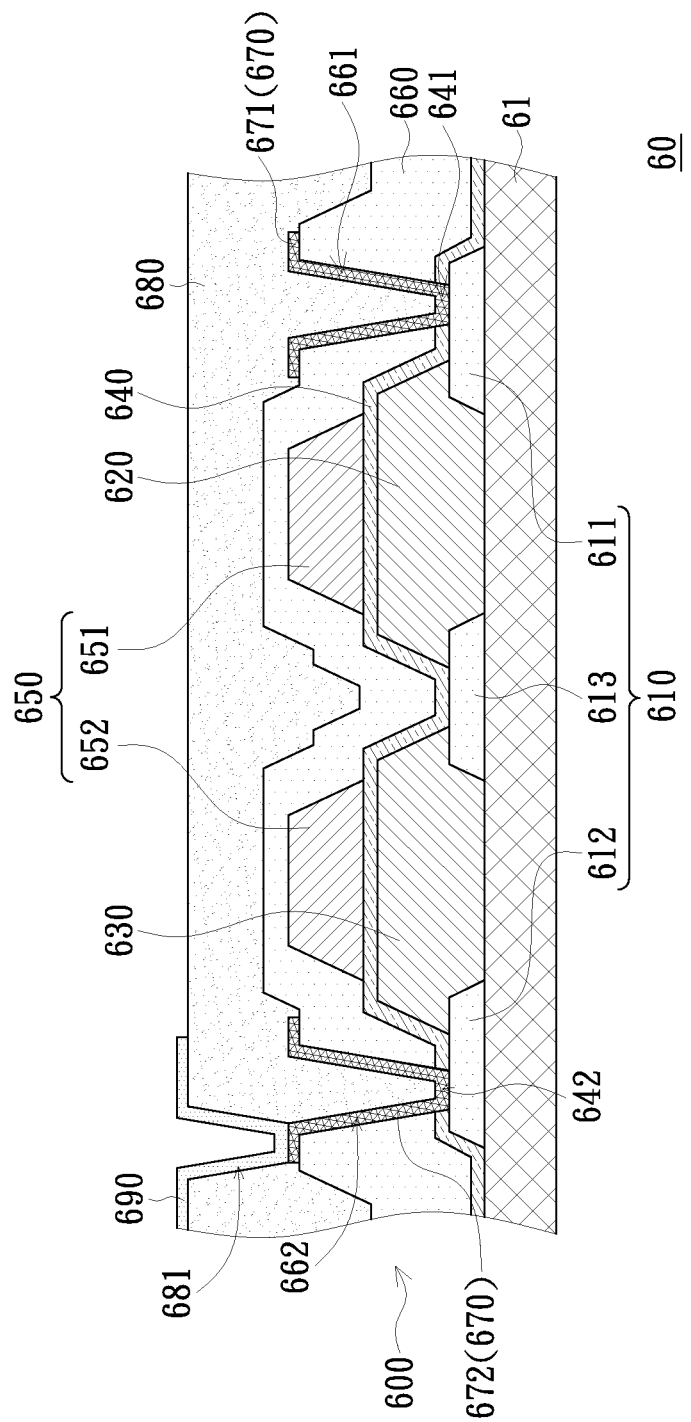
FIG. 14 is a schematic cross-sectional view showing a TFT substrate having a top gate structure according to another embodiment of the present invention.

FIG. 14 is a schematic cross-sectional view showing a TFT substrate having a top gate structure according to another embodiment of the present invention. Referring to FIG. 14, a TFT substrate 60 of the present embodiment includes a substrate 61 and a TFT array disposed on the substrate 61, wherein the TFT array includes a plurality of TFT structures 600 (only one is shown in FIG. 14). Similar to above embodiments, the substrate 61 be a rigid substrate or a flexible substrate. Further, the TFT structure 600 includes a source and drain layer 610, a first channel island 620, a second channel island 630, a gate insulator layer 640 and a gate layer 650.

The source and drain layer 610 is disposed on the substrate 61 and includes a source electrode 611, a drain electrode 612 and an intermediate electrode 613 disposed between the drain electrode 612 and the source electrode 611. The first channel island 620 partially covers the source electrode 611 and the intermediate electrode 613, while the second channel island 630 partially covers the drain electrode 612 and the intermediate electrode 613. The gate insulator layer 640 covers the source and drain layer 610 and the first and second channel islands 620, 630. The gate layer 650 is disposed on the gate insulator layer 640 and includes a first gate electrode 651 and a second gate electrode 652 electrically connected to the first gate electrode 651. The first gate electrode 651 and the second gate electrode 652 may be directly connected to a same gate line (not shown) to electrically connected to each other. The first gate electrode 651 and the second gate electrode 652 respectively correspond to the first channel island 620 and the second channel island 630. The first gate electrode 651 and the second gate electrode 652 are parts of the same TFT structure 600.

In the present embodiment, the first and second channel islands 620, 630 may be made of poly-silicon or other appropriate semiconductor material. The TFT structure 600 may be a low temperature poly-silicon (LTPS) TFT structure. Further, the TFT substrate 600 may further include an inter-layer 660, a metal layer 670, a passivation layer 680 and a pixel electrode 690. The inter-layer 660 is a dielectric layer and covers the gate layer 650 and the gate insulator layer 640. The metal layer 670 is disposed on the inter-layer 660 and electrically connected to the source electrode 611 and the drain electrode 612. The metal layer 670 may include a first metal pattern 671 and a second metal pattern 672. The first metal pattern 671 is connected to the source electrode 611 via two corresponding via holes 641, 661 of the gate insulator layer 640 and the inter-layer 660. The second metal pattern 672 is connected to the drain electrode 612 via another two corresponding via holes 642, 662 of the gate insulator layer 640 and the inter-layer 660. The passivation layer 680 covers the metal layer 670 and the inter-layer 660. The pixel electrode 690 is disposed on the passivation layer 680 and electrically connected to the drain electrode 612. More specifically, the pixel electrode 690 is connected to the second metal pattern 672 via a via hole 681 of the passivation layer 680, so as to electrically connect to the drain electrode 612 through the second metal pattern 672.

Since the TFT structure 600 has a dual channel island structure, current leakage caused by external light or the curvature of the TFT substrate 60 is prevented. Thus, the dual channel island structure is advantageous in preventing abnormal displaying and improving display quality of the display device using the TFT substrate 60.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A thin film transistor (TFT) substrate, comprising:
   a substrate, wherein the substrate is a flexible substrate; and
   a TFT structure, disposed on the substrate and comprising:
      a gate layer, disposed on the substrate and comprising a first gate electrode and a second gate electrode electrically connected to the first gate electrode, wherein the first gate electrode and the second gate electrode are parts of the same TFT structure;
      a gate insulator layer, disposed on the substrate and covering the first and second gate electrodes;
      a first channel island, disposed on the gate insulator layer and corresponding to the first gate electrode;
      a second channel island, disposed on the gate insulator layer and corresponding to the second gate electrode, wherein the first and second channel islands are made of metal oxide; and
      a source and drain layer, disposed on the gate insulator layer and next to the first and second channel islands, wherein the source and drain layer partially covers a top surface of the first channel island and a top surface of the second channel island, wherein the gate insulator layer is a first multilayer structure which comprises a first silicon nitride layer covering the first and second gate electrodes and a first silicon oxide layer covering the first silicon nitride layer, and the TFT substrate further comprises:
a passivation layer, which is a second multilayer structure and comprises:
a second silicon oxide layer covering the source and drain layer and the first and second channel islands; and
a second silicon nitride layer covering the second silicon oxide layer; and
a pixel electrode, disposed on the second silicon nitride layer and electrically connected to a drain electrode of the source and drain layer.

2. The TFT substrate of claim 1, wherein the substrate comprises a flexible base and a barrier layer disposed on the flexible base.

3. The TFT substrate of claim 2, wherein the flexible base is made of at least one of polyimide and polyethylene terephthalate, and the barrier layer is a single layer structure or a multilayer structure and made of at least one of silicon nitride, silicon oxide, silicon oxynitride and organic-inorganic composite material.

4. The TFT substrate of claim 1, wherein the first and second channel islands are made of organic semiconductor material.

5. The TFT substrate of claim 1, further comprising:
a passivation layer, covering the source and drain layer and the first and second channel islands; and
a pixel electrode, disposed on the passivation layer and electrically connected to a drain electrode of the source and drain layer.

6. The TFT substrate of claim 5, wherein the passivation layer is made of at least one of resin, silicon oxide, silicon nitride and silicon oxynitride.

7. A display device, comprising:
a TFT substrate, comprising a substrate, a TFT structure disposed on the substrate, a passivation layer and a pixel electrode, wherein the substrate is a flexible substrate and the TFT structure comprises:
a gate layer, disposed on the substrate and comprising a first gate electrode and a second gate electrode electrically connected to the first gate electrode, wherein the first gate electrode and the second gate electrode are parts of the same TFT structure;
a gate insulator layer, disposed on the substrate and covering the first and second gate electrodes;
a first channel island, disposed on the gate insulator layer and corresponding to the first gate electrode;
a second channel island, disposed on the gate insulator layer and corresponding to the second gate electrode, wherein the first and second channel islands are made of metal oxide;
a source and drain layer, disposed on the gate insulator layer and next to the first and second channel islands, wherein the source and drain layer partially covers a top surface of the first channel island and a top surface of the second channel island, the passivation layer covers the source and drain layer and the first and second channel islands, and the pixel electrode is disposed on the passivation layer and electrically connected to a drain electrode of the source and drain layer, wherein the gate insulator layer is a first multilayer structure which comprises a first silicon nitride layer covering the first and second gate electrodes and a first silicon oxide layer covering the first silicon nitride layer, and the passivation layer is a second multilayer structure which comprises:
a second silicon oxide layer covering the source and drain layer and the first and second channel islands; and
a second silicon nitride layer covering the second silicon oxide layer;
an opposite substrate, disposed opposite to the TFT substrate; and
a display medium layer, disposed between the TFT substrate and the opposite substrate.

8. The display device of claim 7, wherein the opposite substrate and the display medium layer are integrated into a front laminate plate.

9. The display device of claim 7, wherein the substrate comprises a flexible base and a barrier layer disposed on the flexible base.

10. The display device of claim 9, wherein the flexible base is made of at least one of polyimide and polyethylene terephthalate, and the barrier layer is a single layer structure or a multilayer structure and made of at least one of silicon nitride, silicon oxide, silicon oxynitride and organic-inorganic composite material.

11. The display device of claim 7, wherein the first and second channel islands are made of organic semiconductor material.

12. The display device of claim 7, wherein the passivation layer is made of at least one of resin, silicon oxide, silicon nitride and silicon oxynitride.

13. A TFT substrate, comprising:
a substrate; and
a TFT structure, disposed on the substrate and comprising:
a source and drain layer, disposed on the substrate and comprising a source electrode, a drain electrode and an intermediate electrode disposed between the drain electrode and the source electrode;
a first channel island, partially covering the source electrode and the intermediate electrode;
a second channel island, partially covering the drain electrode and the intermediate electrode;
a gate insulator layer, covering the source and drain layer and the first and second channel islands; and
a gate layer, disposed on the gate insulator layer and comprising a first gate electrode and a second gate electrode electrically connected to the first gate electrode, wherein the first gate electrode and the second gate electrode respectively correspond to the first channel island and the second channel island, and the first gate electrode and the second gate electrode are parts of the same TFT structure.

14. The TFT substrate of claim 13, wherein the first and second channel islands are made of poly-silicon.

15. The TFT substrate of claim 13, wherein the substrate is a flexible substrate or a rigid substrate.

16. The TFT substrate of claim 13, further comprising:
an inter-layer, covering the gate layer and the gate insulator layer;
a metal layer, disposed on the inter-layer and electrically connected to the source electrode and the drain electrode;
a passivation layer, covering the metal layer and the inter-layer; and a pixel electrode, disposed on the passivation layer and electrically connected to the drain electrode.

\* \* \* \* \*